United States Patent [19]

Hawkins

[11] Patent Number: 4,935,750

[45] Date of Patent: Jun. 19, 1990

[54] SEALING MEANS FOR THERMAL INK JET PRINTHEADS

[75] Inventor: William G. Hawkins, Webster, N.Y.

[73] Assignee: Xerox Corporation, Stamford, Conn.

[21] Appl. No.: 401,599

[22] Filed: Aug. 31, 1989

[51] Int. Cl.$^5$ .................... G01D 15/18; H01L 21/306

[52] U.S. Cl. .................................. 346/140 R; 346/75; 156/626

[58] Field of Search ........................... 346/75, 140 PD

[56] References Cited

U.S. PATENT DOCUMENTS

| | | | |
|---|---|---|---|
| Re. 32,572 | 1/1988 | Hawkins et al. | 156/626 |
| 4,068,144 | 1/1978 | Toye | 346/140 PD X |
| 4,153,901 | 5/1979 | White et al. | 346/75 |
| 4,245,225 | 1/1981 | Fillmore et al. | 346/75 |
| 4,354,194 | 10/1982 | Barteck | 346/75 |
| 4,463,359 | 7/1984 | Ayata et al. | 346/1.1 |
| 4,564,846 | 1/1986 | Siegal | 346/140 PD X |
| 4,567,493 | 1/1986 | Ikeda et al. | 346/140 R |
| 4,571,599 | 2/1986 | Rezanka | 346/140 R |
| 4,577,202 | 3/1986 | Hara | 346/140 R |
| 4,598,303 | 7/1986 | Peekema et al. | 346/140 PD |
| 4,638,337 | 1/1987 | Torpey et al. | 346/140 R |
| 4,678,529 | 7/1987 | Drake et al. | 156/234 |
| 4,831,390 | 5/1989 | Deshpande et al. | 346/140 PD |

*Primary Examiner*—George H. Miller, Jr.
*Attorney, Agent, or Firm*—Robert A. Chittum

[57] ABSTRACT

A thermal ink jet printhead having an ink inlet and a plurality of droplet emitting nozzles is disclosed in which a patterned gasket is provided around each inlet during mass printhead fabrication. A plurality of printheads are obtained by dicing two mated substrates mounted in a holding film frame. A confronting surface of one of the substrates contains a plurality of sets of heating elements and addressing electrodes. The confronting surface of the other substrate contains a plurality of sets of recesses which serve as ink flow directing channels in communication with the nozzles and a reservoir having inlets in the opposite surface of the other substrate. In one embodiment, a polymeric thick film layer is deposited and photo-patterned to provide each inlet with a gasket, the surface of which is coated with a reflowable and curable adhesive for adherence to an ink supply such as an ink cartridge. In another embodiment, a compliant material such as silicone is screen printed directly around the printhead inlets.

7 Claims, 4 Drawing Sheets

SEALING MEANS FOR THERMAL INK JET PRINTHEADS

BACKGROUND OF THE INVENTION

1. Field of the Invention

This invention relates to thermal ink jet printing systems and, more particularly, to means for sealing the interface between the printheads and their ink supply sources in a reliable, cost effective manner.

2. Description of Prior Art

Thermal ink jet printing systems use thermal energy selectively produced by resistors located in capillary filled ink channels near channel terminating nozzles or orifices to vaporize momentarily the ink and form bubbles on demand. Each temporary bubble expels an ink droplet and propels it towards a recording medium. The printing system may be incorporated in either a carriage type printer or a pagewidth type printer. The carriage type printer generally has a relatively small printhead, containing the ink channels and nozzles. The printhead is usually sealingly attached to a disposable ink supply cartridge and the combined printhead and cartridge assembly is reciprocated to print one swath of information at a time on a stationarily held recording medium, such as paper. After the swath is printed, the paper is stepped a distance equal to the height of the printed swath, so that the next printed swath will be contiguous therewith. The procedure is repeated until the entire page is printed. For an example of a cartridge type printer, refer to U.S. Pat. No. 4,571,599 to Rezanka. In contrast, the pagewidth printer has a stationary printhead having a length equal to or greater than the width of the paper. The paper is continually moved past the pagewidth printhead in a direction normal to the printhead length and at a constant speed during the printing process. Refer to U.S. Pat. No. 4,463,359 to Ayata et al, especially FIGS. 17 and 20 therein, and copending U.S. application Ser. No. 280,104 entitled "Fabricating Process for Large Array Semiconductive Devices", filed Dec. 5, 1988, and assigned to the same assignee as the present invention for examples of pagewidth thermal ink jet printing systems.

U.S. Pat. No. Re. 32,572 to Hawkins et al discloses a thermal ink jet printhead and method of fabrication. In this case, a plurality of printheads may be concurrently fabricated by forming a plurality of sets of heating elements with their individual addressing electrodes on one substrate, generally a silicon wafer, and etching corresponding sets of channel grooves with a common recess for each set of grooves in another silicon wafer. The wafer and substrate are aligned and bonded together so that each channel has a heating element. The individual printheads are obtained by milling away the unwanted silicon material to expose the addressing electrode terminals and then dicing the substrate to form separate printheads.

U.S. Pat. No. 4,638,337 to Torpey et al discloses an improved printhead of the type disclosed in the patent to Hawkins et al wherein the bubble generating resistors are located in recesses to prevent lateral movement of the bubbles through the nozzles and thus preventing sudden release of vaporized ink to the atmosphere.

U.S. Pat. No. 4,678,529 to Drake et al discloses a method of bonding the ink jet printhead channel plate and heater plates together by a process which provides the desired uniform thickness of adhesive on the mating surfaces and prevents the flow of adhesive into the fluid passageways.

U.S. Pat. No. 4,567,493 to Ikeda et al and U.S. Pat. No. 4,577,202 to Hara disclose a liquid jet recording head, including a plurality of protection layers, one of which has a region that directly contacts the liquid. A principal function of the protection layer is to prevent penetration by the liquid and therefore prevent a failure mode for the bubble generating resistors and their addressing electrodes. Hara discloses in FIG. 2*b* a tubing connection 220 and the patent to Ikeda et al omits details of the ink supply interface.

At present, there is a problem of reliably and cost effectively sealing the thermal ink jet printheads to their ink supplies, whether they are integrally mounted to disposable ink supply cartridges or permanent pagewidth types. None of the above prior art printheads provide a satisfactory solution to this problem.

SUMMARY OF THE INVENTION

It is the object of the present invention to provide a patterned gasket for the ink inlets of thermal ink jet printheads during fabrication of the printheads.

It is another object of the invention to provide simultaneously gaskets about all of the inlets of the printheads produced in mass by the mating of wafers, one containing a plurality of sets of ink flow directing recesses and the other containing a plurality of sets of heating elements and addressing electrodes.

It is still another object of the invention to screen an adhesive on each patterned gasket surrounding each inlet of the plurality of printheads contained in a pair of mated substrates before or after the mated substrates are diced into individual printheads, but prior to their separation from the holding film frame in which the mated substrates are diced. The adhesive may be reflowed and cured after the individual printheads are sealingly attached to associated ink supply cartridges.

In the present invention, a thermal ink jet printhead having an ink inlet and a plurality of droplet emitting nozzles is disclosed in which a photolithographically definable or screen printed gasket is provided around each inlet during mass printhead fabrication. A plurality of printheads are obtained by dicing two mated substrates mounted in a holding film frame. A confronting surface of one of the substrates contains a plurality of sets of heating elements and addressing electrodes. The confronting surface of the other substrate contains a plurality of sets of recesses which serve as ink flow directing channels in communication with the nozzles and a reservoir having inlets in the opposite surface of the other substrate. A polymeric thick film layer is deposited and photopatterned or deposited by screen printing to provide each inlet with a gasket, the surface of which is coated with a reflowable and curable adhesive for adherence to an ink supply such as an ink cartridge.

The foregoing features and other objects will become apparent from a reading of the following specification in conjunction with the drawings, wherein like parts have the same index numerals.

DESCRIPTION OF THE PREFERRED EMBODIMENT

Figure 1:
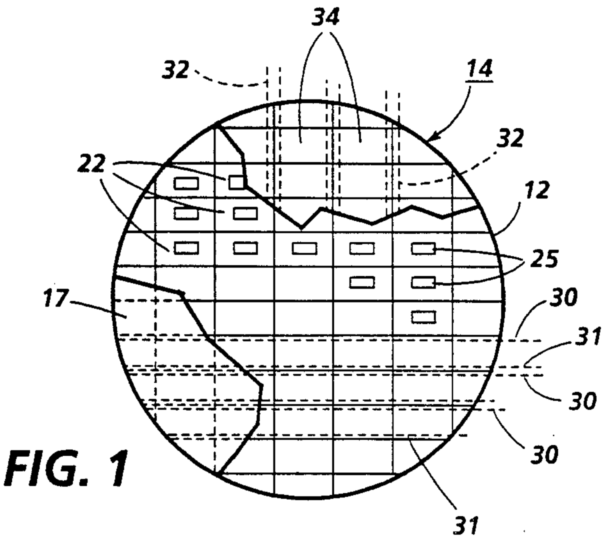
FIG. 1 is a schematic plan view of aligned and mated silicon wafers with the top wafer containing a plurality of channel plates partially removed to expose the lower wafer below containing a plurality of heater plates. Dashed lines indicate where vertical and horizontal dicing is to be conducted to produce a plurality of individual printheads.

In FIG. 1, a two side polished, (100) silicon wafer 12 is used to produce the plurality of channel plates 22 for mating with an insulative substrate 14, which, in the preferred embodiment, is a one side polished (100) silicon wafer having a silicon nitride insulative layer (not shown) on the surfaces thereof. The wafer 14 is used to produce a plurality of heater plates 24. As is well known in the art, the channel plate wafer 12 is aligned and bonded to the heater plate wafer 14 for subsequent dicing into a plurality of individual printheads 10 which may be used either in a carriage type ink jet printer 11 (see FIG. 4) as disclosed in U.S. Pat. Nos. Re. 32,572 to Hawkins et al and 4,571,599 to Rezanka or as a fully functional printhead sub-unit linearly abutted together to form a pagewidth printhead 13 (see FIG. 5) as disclosed in copending U.S. patent application Ser. No. 280,104, filed Dec. 5, 1988 to Fisher et al, and assigned to the same assignee as the present invention.

Figure 2:
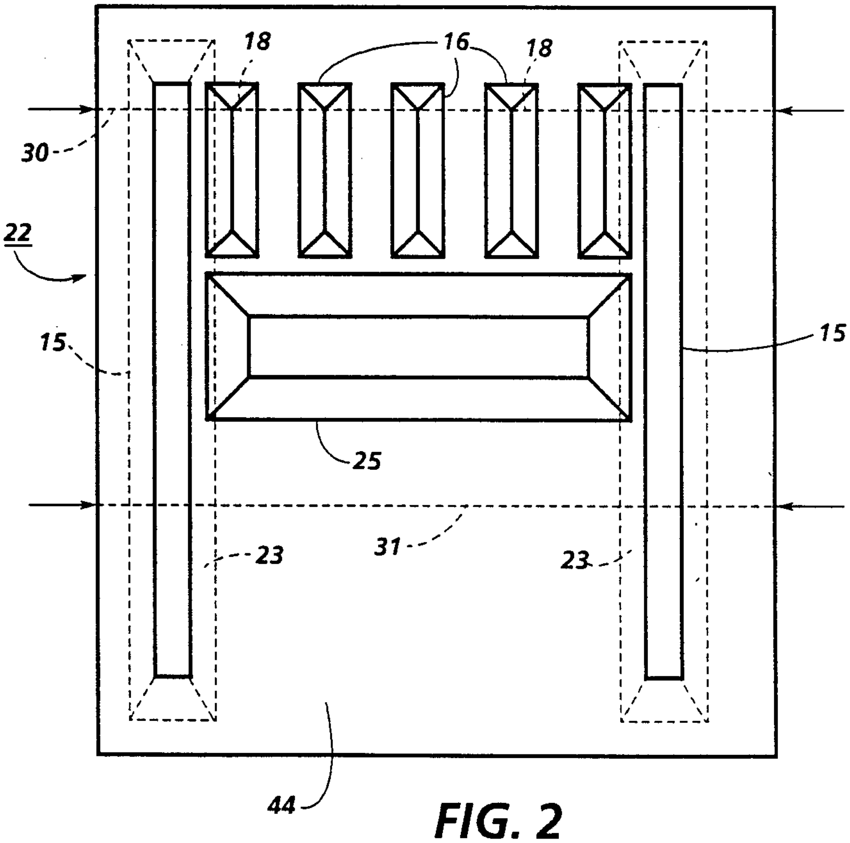
FIG. 2 is an enlarged schematic plan view of one channel plate of the plurality contained in the top wafer of FIG. 1.

After the wafer 12 is chemically cleaned, a silicon nitride layer (not shown) is deposited on both sides. Using conventional photolithography, vias for elongated slots 15 (see FIG. 2) for each channel plate 22 are printed on the side of the wafer shown in FIG. 1. The silicon nitride is plasma etched off of the patterned vias representing the elongated slots. A potassium hydroxide (KOH) anisotropic etch is used to etch the elongated slots. In this case, the {111} planes of the (100) wafer make an angle of 54.7° with the surface of the wafer. These vias are sized so that they are entirely etched through the 20 mil thick wafer.

Next, the opposite side 44 of wafer 12 is photolithographically patterned, using the slots 15 as a reference to form the plurality of sets of channel grooves 16, and one or more fill holes 25 per set of channel grooves. This fabricating process requires that parallel milling or dicing cuts be made later which are perpendicular to the channel grooves 16. One dicing cut is made at the end of the channel grooves 16 opposite the ends adjacent the fill hole, as indicated by dashed line 30. Another one is made on the opposite side of the fill holes, as indicated by dashed line 31, in order to obtain a channel plate with sloping sides 23 produced by the anisotropic etching. The fill holes 25 may be placed into communication with the ink channels 16 by isotropic etching as taught in Reissue Pat. No. Re. 32,572 referenced above or by etching flow paths in a thick film layer on the heating element plates as taught by U.S. Pat. No. 4,774,530 to Hawkins.

Figure 3:
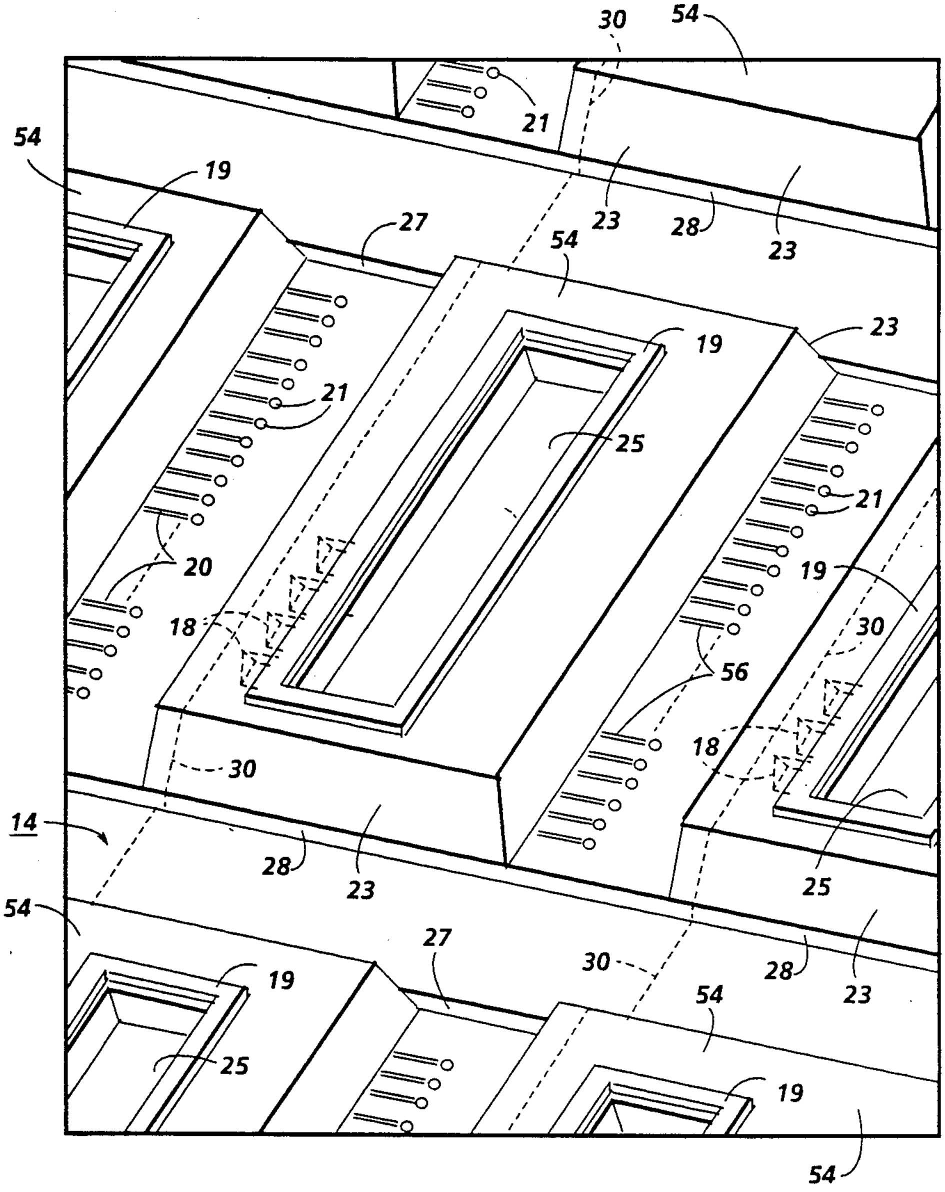
FIG. 3 is an enlarged isometric view of the channel plate wafer bonded to the heater plate wafer showing the patterned gaskets of the present invention, after the unwanted channel plate wafer material has been removed.

A plurality of sets of heating elements with addressing electrodes 20 (see FIG. 3) are formed on one surface of substrate or wafer 14, which may also be a silicon wafer, by means well known in the art. This substrate or wafer 14 is aligned and mated to the etched channel wafer 12 as taught by No. Re. 32,572. After the channel plate wafer 12 and heater plate wafer 14 are aligned and bonded together, a thick film, photo-patternable layer 17, such as, for example, Vacrel®, having a thickness of between 1 and 6 mils (25 to 150 micrometers) is laminated on the outer surface of the channel plate wafer. The thick film layer 17 is exposed through a mask, developed, and cured, so that each inlet 25 of the channel plates 22 has a surrounding gasket 19 bonded to the surface of the channel plate wafer. Alternately, a compliant or elastic material such as silicone can be screen printed directly on the channel plate to form thick film gaskets 19. Next, dicing cuts are made to remove unwanted silicon wafer material from wafer 12 in order to expose the heating element electrode terminals 21 on wafer 14. Referring to FIG. 3, an isometric view of the mated wafers is shown before the final dicing operation is conducted along dicing lines 30 to produce the individual printheads or printhead sub-units 10 and concurrently to open the nozzles 18. Each portion or heater plate 24 of wafer 14 contains a set of heating elements and addressing electrodes, and has a remaining channel plate portion 54 bonded thereto, as explained later. Pairs of dicing lines 32, shown in dashed lines in FIG. 1 and shown as kerfs 27, 28 in FIG. 3, delineate how the wafer 14 is cut into fully operational printhead or printhead sub-units 10 when dicing along cutting line 30 is accomplished. Inlets 25 in the channel plate portions 54 have gaskets 19 produced by the photo-fabricating or screen printing process mentioned above.

The isometric view of the mated channel and heater plate wafers are shown in FIG. 3 after the unwanted silicon of wafer 12 that covers the addressing electrode terminals on wafer 14 have been removed. This removal of silicon from one wafer without damaging the terminals on the other wafer is disclosed in the patents discussed above. The pairs of dicing cuts along dicing line pairs 32 have also been conducted and oppositely sloping kerfs 27, 28 are shown parallel with and adjacent the slanted channel plate sides 23 of the remaining portions 54 of the channel plates 22. The channel plate sides were formed by anisotropic etching, so that they are {111} crystal planes. The {111} planes have an angle with the surface of the channel wafer of about 54.7 degrees. This slope enables angling of the dicing blade to provide the slanted kerfs 27, 28. The dicing along line 30 remains to be accomplished and this dicing operation not only produces a plurality of printheads or printhead sub-units 10, but concurrently opens the channel grooves or recesses 16 to provide nozzles 18.

Figure 4:
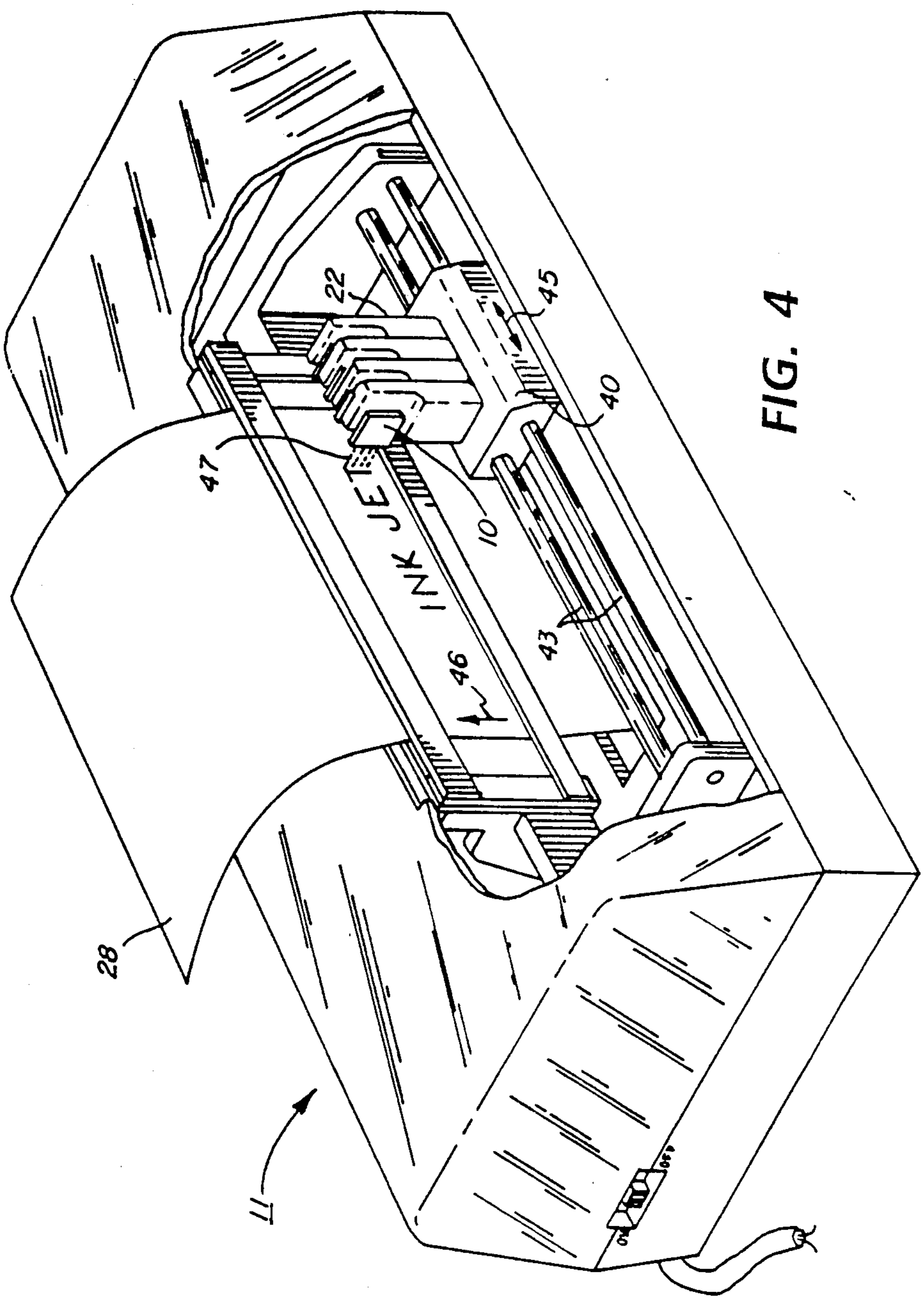
FIG. 4 is a schematic isometric view of a multicolor, carriage type thermal ink jet printer showing a plurality of disposable ink cartridges having integral printheads mounted on a translatable carriage.

Before or after the mated wafers are diced, but prior to separation from the holding film frame (not shown), an adhesive such as a reflowable epoxy (B stage epoxy) is screened onto the gasket surface, so that the cost of this fabricating step is very little on a cost per printhead basis. The epoxy is reflowed and cured after the individual printheads 10 are diced and removed from the film frame and assembled to the disposable ink cartridges 26 (FIG. 4).

As disclosed in U.S. Pat. No. 4,571,599 to Rezanka and shown in FIG. 3, a multicolor thermal ink jet printer 11 is shown containing several disposable ink supply cartridges 22, each with an integrally attached printhead 10 having the photo-definable or screen printed gasket of the present invention. The cartridge and printhead combination are removably mounted on a translatable carriage 40. During the printing mode, the carriage reciprocates back and forth on, for example, guide rails 43 parallel to the recording medium 28 as depicted by arrow 45. The recording medium, such as, for example, paper, is held stationary while the carriage is moving in one direction and, prior to the carriage moving in a reverse direction, the paper is stepped in the direction of arrow 46 a distance equal to the height of the swath of data printed thereon by the printheads 10 during traversal in one direction across the paper. The droplets are ejected on demand from the nozzles 18 of the printheads along the trajectories 47 to the paper. The front face of the printhead is spaced from the paper a distance of between 0.01 and 0.1 inch, with the preferred distance being about 0.02 inches. The stepping tolerance for the paper and the linear deviation of the printheads are held within acceptable limits to permit contiguous swaths of information to be printed without gaps or overlaps.

Each cartridge 26 contains a different colored ink, one black and one to three additional cartridges of different selected colors. The combined cartridge and printhead is removed and discarded after the ink supply in the cartridge has been depleted. In this environment, some of the nozzles do not eject droplets during one complete carriage traversal and, generally, none of the nozzles eject droplets as the printheads move beyond the edge of the paper. While at this end of a carriage traversal, there is a small dwell time while the paper is being stepped one swath in height in the direction of arrow 46. Between the printheads 10 and cartridges 26 of prior art devices there is a problem of leakage which the present invention resolves by either the patterning of a photo-definable gasket or screen printing of a gasket on an entire wafer scale during printhead fabrication. The size of the printhead is currently driven by the ability to make leak-free fluidic interconnection. Since the gaskets of the present invention are capable of high resolution with very tight dimensional tolerance, the printhead sizes and cost of sealingly attachment to the cartridges are reduced.

Figure 5:
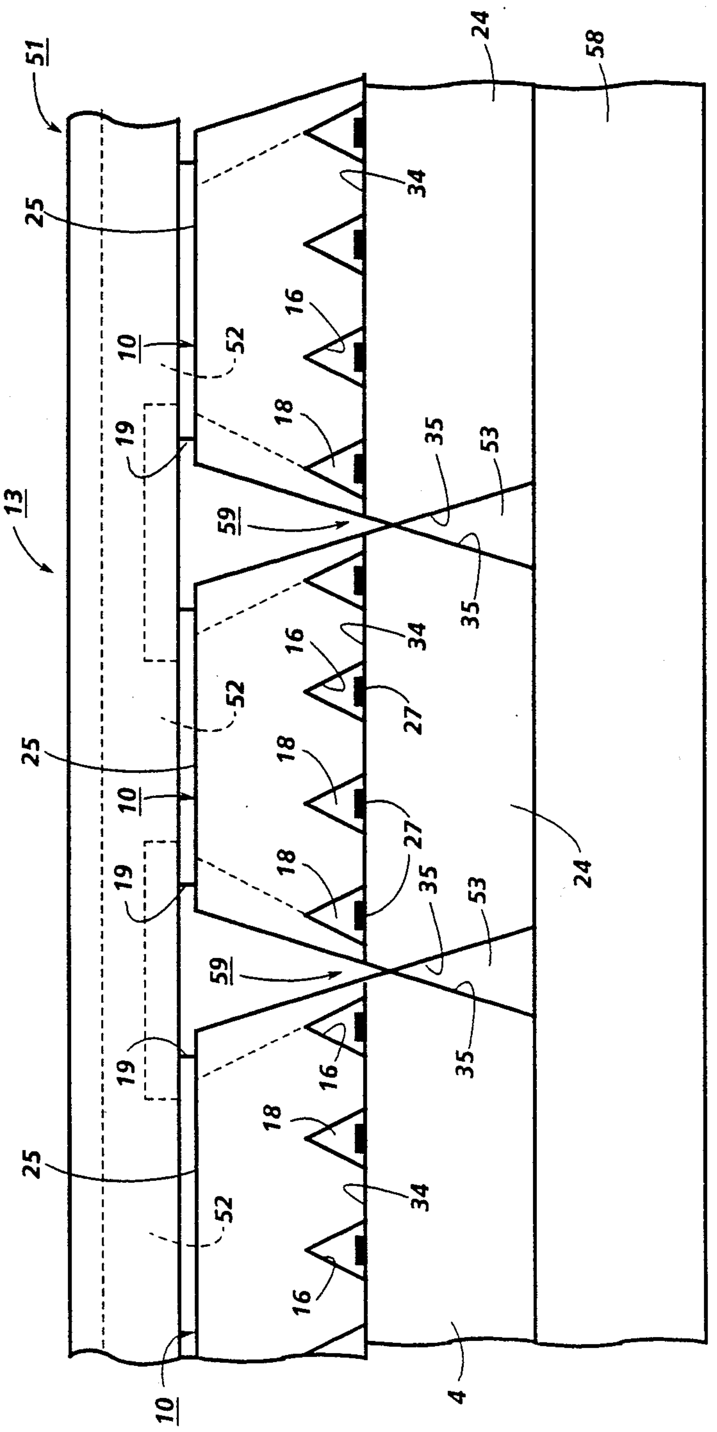
FIG. 5 is an enlarged, partially shown front view of a pagewidth printhead formed from the abutment of smaller printheads produced by the dicing of the mated wafers of FIG. 1.

FIG. 5 is an enlarged, partially shown front elevation view of a pagewidth ink jet printhead 13 that is assembled from printhead sub-units 10. Schematically illustrated heating elements 27 are shown in each channel 16 through nozzles 18. In this pagewidth embodiment, a very small V-groove 59 is optionally anisotropically etched in the surface of heater plate wafer 14 parallel to and on opposing sides of each set of heating elements, so that the slightly slanted dicing used to produce slanted walls 35 do not cut through the surface 34 containing the heating elements and supporting electrodes and circuitry (not shown). This eliminates all microcracking because the dicing blade only cuts outside of the {111} plane of the small V-groove 59. The confronting walls 35 of the heater plate 24 were produced by dicing along dicing lines 32. This dicing is optionally done with a slightly slanted dicing blade for reasons stated above and to enable the close tolerance abutting the printhead sub-units 10. The oppositely sloping walls 35 produce gaps 53, because the bottom surface of the heater plates 24 are smaller than the top surfaces 34 when the dicing cut is made by slanted dicing blades which are slanted in equal but opposite directions. To strengthen the pagewidth printhead 13, the gaps 53 between the heater plates 24 specifically generated by the slanted kerfs 27, 28 may be optionally filled (not shown) with a flowable epoxy or other suitable adhesive.

The pagewidth printhead 13 may be further stabilized and strengthened by assembly of the printhead sub-units 10 on a flat structural member 58. Assembly of the pagewidth printhead 13 is complete when an elongated, hollow conduit means 51 having outlets 52, each aligned with the inlets 25 of the printhead sub-units 10. Gaskets 19 are sealed to the conduit means 51 by, for example, the adhesive earlier screened onto the gasket. The gasket sealingly surrounds the printhead sub-unit inlet and outlets of the conduit means and prevents the ink supplied to the printhead sub-units via the conduit means for leaking at the interface therebetween.

Many modifications and variations are apparent from the foregoing description of the invention and all such modifications and variations are intended to be within the scope of the present invention.

I claim:

1. An improved thermal ink jet printhead of the type having a plurality of ink channels with each containing a multi-layered thermal transducer therein, an ink reservoir with ink inlet, and a plurality of ink droplet emitting nozzles, said channels being in communication with the recess, so that ink fills the channels and selective application of electrical pulses representing digitized data to the thermal transducers eject and propel ink droplets from the printhead to a recording medium, wherein the improvement comprises:

a patterned gasket being provided to surround the ink reservoir inlet during printhead fabrication; and an adhesive being screened on the gasket and cured after the printhead is assembled to an ink supply means.

2. The printhead of claim 1, wherein said adhesive is a reflowable epoxy which is reflowed and cured after the printhead reservoir inlet is aligned and mated with said ink supply means.

3. The printhead of claim 2, wherein the patterned gasket is photolithographically defined from a layer of photo-patternable material.

4. The printhead of claim 2, wherein the patterned gasket is screen printed with a compliant material.

5. A method of fabricating a thermal ink jet printhead with ink supply comprising the steps of:

(a) fixedly mating a first substrate with a second substrate, the first substrate having a plurality of ink flow directing sets of recesses in one surface thereof, each set of recesses having a reservoir with an open bottom which serves as an inlet and a plurality of parallel channels which communicate at one end with the reservoir recess, the second substrate having on one surface thereof a plurality of sets of heating elements and addressing electrodes, said mating of substrates placing a resistor in each channel;

(b) patterning a plurality of gaskets on the surface of the mated substrates which has the inlets in a manner such that each inlet is surrounded by a patterned gasket;

(c) mounting the mated substrates with the thick film gaskets on a film frame suitable for holding said mated substrates during dicing thereof;

(d) screening an adhesive on the gaskets;

(e) dicing the mated substrates to produce a plurality of individual printheads;

(f) removing the printheads from the film frame; and (g) aligning and adhering each inlet gasket of the printhead to an ink supply outlet.

6. The method of claim 5, wherein step (b) comprises the steps of:

(b.1) patterning a plurality of gaskets on the surface of the mated substrates which has the inlets in a manner such that each inlet is surrounded by a patterned gasket;

(b.2) mounting the mated substrates with the thick film gaskets on a film frame suitable for holding said mated substrates during dicing thereof.

7. The method of claim 5, wherein step (b) comprises screen printing a thick film elastic material to produce the gaskets which surround each inlet.

* * * * *